(12) United States Patent
Kwong

(10) Patent No.: US 6,320,408 B1
(45) Date of Patent: Nov. 20, 2001

(54) DUAL-SIDED UNDERSHOOT-ISOLATING BUS SWITCH

(75) Inventor: David Kwong, Fremont, CA (US)

(73) Assignee: Pericom Semiconductor Corp., San Jose, CA (US)

(*) Notice: Subject to any disclaimer, the term of this patent is extended or adjusted under 35 U.S.C. 154(b) by 0 days.

(21) Appl. No.: 09/681,236

(22) Filed: Mar. 2, 2001

(51) Int. Cl.[7] .............................................. H03K 19/0175
(52) U.S. Cl. .......................... 326/31; 326/86; 326/81; 327/437; 327/427; 327/391
(58) Field of Search .................... 326/81, 86, 31; 327/437, 427, 387, 391, 534

(56) References Cited

U.S. PATENT DOCUMENTS

| | | | |
|---|---|---|---|
| 4,893,029 | 1/1990 | Matsuo et al. | 307/296.4 |
| 4,945,267 * | 7/1990 | Galbraith | 307/571 |
| 5,442,304 | 8/1995 | Wong et al. | 326/17 |
| 5,444,397 * | 8/1995 | Wong et al. | 326/81 |
| 5,502,329 | 3/1996 | Pezzani | 257/546 |
| 5,751,168 | 5/1998 | Speed, III et al. | 326/83 |
| 5,808,502 | 9/1998 | Hui et al. | 327/333 |
| 5,880,620 | 3/1999 | Gitlin et al. | 327/534 |
| 5,963,080 | 10/1999 | Miske et al. | 327/534 |
| 6,034,553 * | 3/2000 | Kwong | 326/86 |
| 6,052,019 | 4/2000 | Kwong | 327/437 |
| 6,069,493 | 5/2000 | Pigott et al. | 326/83 |
| 6,100,719 * | 8/2000 | Graves et al. | 326/86 |
| 6,236,259 * | 5/2001 | Goodell et al. | 327/534 |

* cited by examiner

*Primary Examiner*—Michael Tokar
*Assistant Examiner*—Vibol Tan
(74) *Attorney, Agent, or Firm*—Stuart T. Auvinen

(57) ABSTRACT

Both buses connected to a bus switch are protected from undershoots. A bus switch transistor is an n-channel metal-oxide-semiconductor (MOS) with its source connected to a first bus and its drain connected to a second bus. An enable gate drives the gate node of the bus switch transistor high to enable or low to disable. Undershoot sensing circuits are attached to the first and second bus. When a low-going transition is detected by an undershoot sensing circuit, an n-channel connecting transistor is turned on, connecting the bus with the low-going transition to the gate node through a grounded-gate n-channel transistor. If an undershoot occurs, it is coupled to the gate node. Since both the gate and source of the bus switch transistor are coupled to the undershoot, the gate-to-source voltage never reaches the transistor threshold and the bus switch transistor remains off.

20 Claims, 5 Drawing Sheets

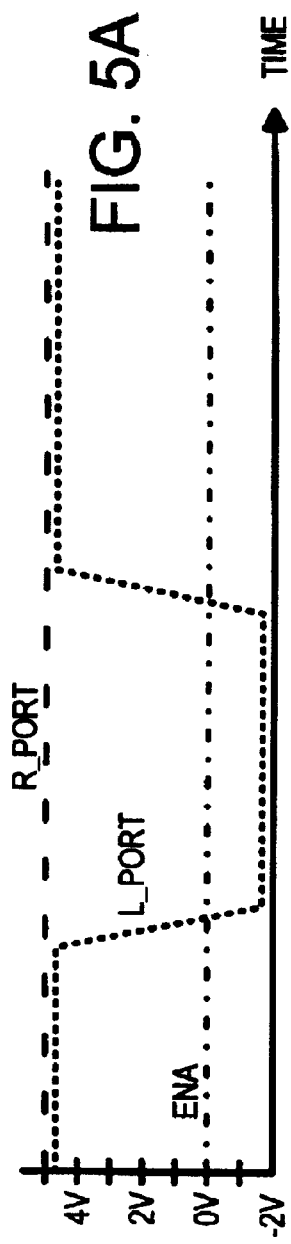
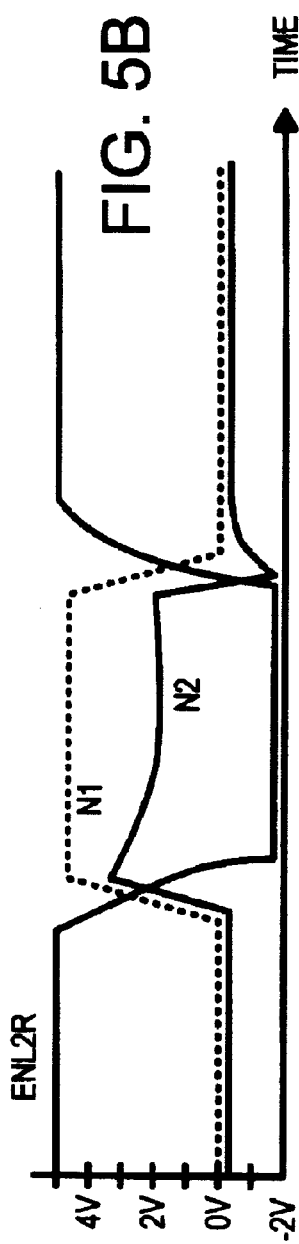
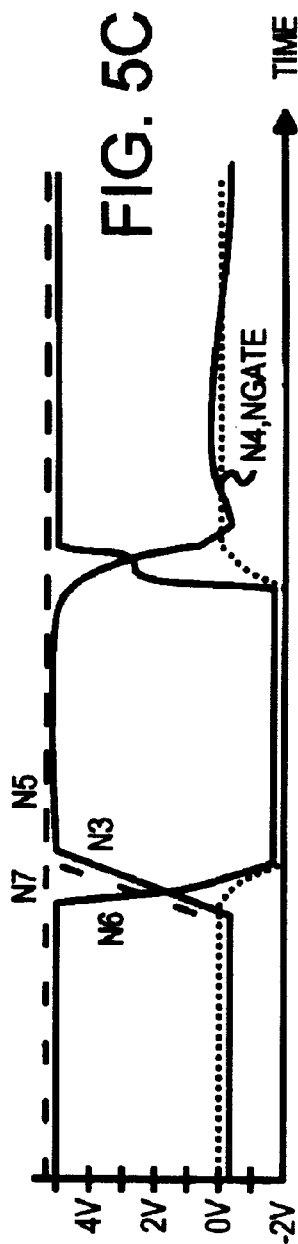

DUAL-SIDED UNDERSHOOT-ISOLATING BUS SWITCH

BACKGROUND OF INVENTION

This invention relates to semiconductor bus switches, and more particularly to bi-directional undershoot protection for a MOS bus switch.

Bus switches are often used in networking applications. Bus switches using metal-oxide-semiconductor (MOS) technology have low on resistance, reducing delay through the switch. The source and drain nodes of a bus-switch transistor connect to the busses while the gate is controlled by a bus-connecting enable signal. See for example Parallel Micro-Relay Bus Switch for Computer Network Communication with Reduced Crosstalk and Low On-Resistance using Charge Pumps, U.S. Pat. No. 5,808,502, and Bus Switch Having Both P- and N-Channel Transistors for Constant Impedance Using Isolation Circuit for Live-Insertion when Powered Down U.S. Pat. No. 6,034,553.

More complex networks are emerging. For example, the bus switch may connect two processor buses. Each processor bus can operate independently of the other. Hot-plugging or hot-swapping of card with the processor bus can also occur. When the bus switch is in the isolation mode, full isolation must occur, regardless of which bus is active.

FIG. 1 shows a typical application of a bus switch. First local bus signals 18 (bus A) is connected to CPU_A 10, memory_A 14, and Application-Specific Integrated Circuit (ASIC_A) 12. Second local bus signals 19 (bus B) is a second local bus that has CPU_B 11, memory_B 15, and Application-Specific Integrated Circuit (ASIC_B) 13. Second local bus signals 19 is a hot-plugable bus. Switch network 16 connects address, data, and control lines from bus signals 18 to bus signals 19 using MOS transistors. One transistor is used for each bus signal.

When a device is plugged into bus signals 19, it may be desired to isolate bus signals 19 from local bus signals 18. Noise caused by the plugging operation can then be isolated to bus signals 19, allowing local bus signals 18 to operate unhindered. Switch network 16 can isolate bus signals 19 from local bus signals 18 by applying a low voltage to n-channel transistors in switch network 16. When switch network 16 isolates, Bus_A can operate independently of Bus_B.

Either Bus_A or Bus_B may be hot-plugged into the other bus. This allows for repair of systems without any downtime. Isolation by switch network 16 must therefore be fully bi-directional since it is not known which bus will be replaced until a failure occurs.

Undershoot Problem

When an n-channel transistor is used as the bus switch, the bus switch is disabled by driving a ground voltage to the gate of the n-channel bus-switch transistor. The output bus signal should be isolated from voltage changes at the input bus signal. The quality of the signal waveforms on local bus signal 18 is not always well controlled. Sometime large voltage spikes below ground (undershoots) occur, especially on the high-to-low transitions from high-current drivers on local bus signal 18. The same could occur on bus signals 19.

When the bus-switch input from bus signal 18 goes below ground, a positive gate-to-source voltage develops on bus-switch transistor since its gate is at ground. A conducting channel forms below the gate. When the undershoot is greater than a volt, this gate-to-source voltage exceeds the n-channel threshold voltage, turning on the n-channel bus switch transistor. Some current is conducted through the channel of the bus-switch transistor even though its gate may be kept at ground. The result is that the voltage is disturbed on the drain of the bus-switch transistor, and the output to bus signals 19.

When the source of the n-channel bus-switch transistor goes negative during the undershoot, the base-emitter junction of the parasitic lateral NPN transistor is forward biased, coupling more current to the output through the p-type substrate.

The result of the undershoot is that the output connects to the input for a short period of time, the duration of the undershoot. The voltage on the drain of the bus-switch transistor can quickly fall from the power supply (Vcc) to ground and even below ground should the undershoot last for more than a few nanoseconds. The undershoots on the input bus coupled to the output, producing severe voltage disturbances on the isolated bus.

The inventor has solved an undershoot-isolation problem in earlier patents, such as U.S. Pat. No. 6,052,019 for Undershcot-lsolating MOS Bus Switch. However, this patent shows a circuit that is effective when the undershoot always occurs on only one side of the bus switch. Another improved circuit using a pulse generator was shown by the inventor in "Bi-Directional Undershoot-Isolating Bus Switch with Directional Control", U.S. Ser. No. 09/607,460, filed Jun. 29, 2000. While useful, a fully bi-directional undershoot-isolating bus switch without the pulse generator is desired.

BRIEF DESCRIPTION OF DRAWINGS

FIGS. 5A–C are waveforms showing operation of the bi-directional undershoot-isolating bus switch in isolation mode.

DETAILED DESCRIPTION

The present invention relates to an improvement in bidirectional bus switches. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
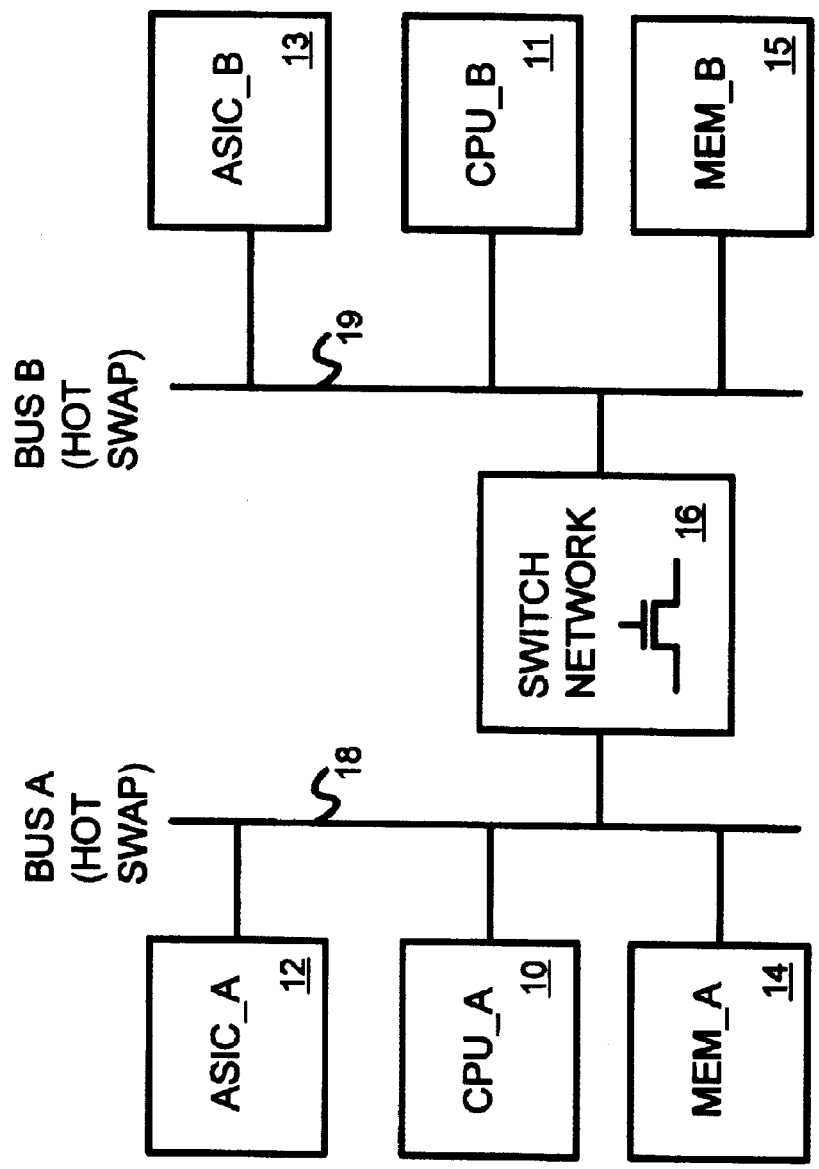
FIG. 1 shows a typical application of a bus switch.
Figure 2:
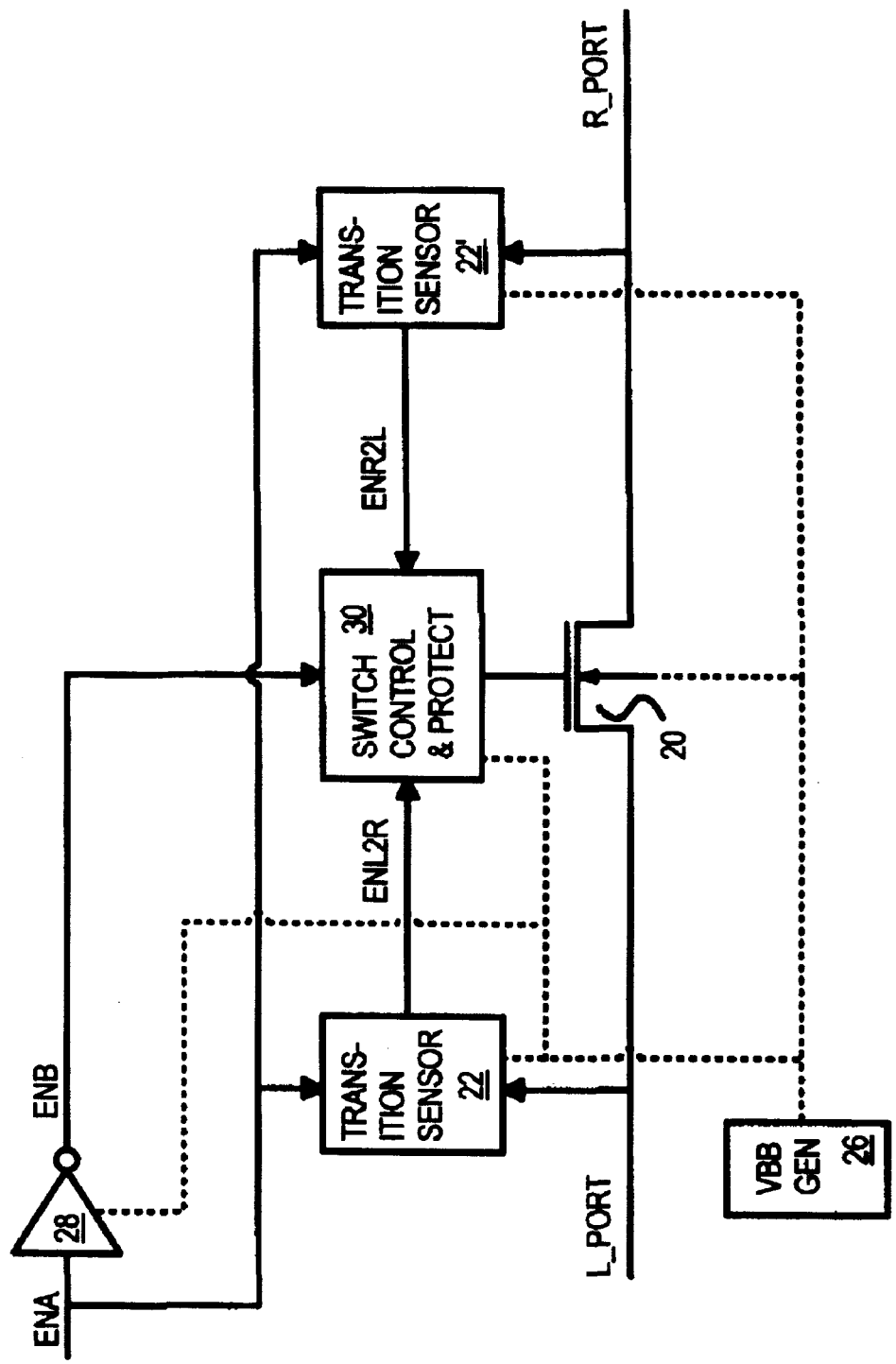
FIG. 2 is a block diagram of a bus switch that is bidirectionally undershoot protected.

FIG. 2 is a block diagram of a bus switch that is bidirectionally undershoot protected. Bus-switch transistor 20 connects the left-port input/output I/O (L_PORT) to the right-port I/O (R_PORT) when enable signal ENA is high. When enable ENA is low, bus-switch transistor 20 isolates the left port from the right port. This isolation is not merely limited to when signals on the right and left ports are within the normal power-to-ground operating range, but also includes isolation from undershoots below ground.

Undershoot sensor 22 is coupled to left-port I/O L_PORT and activates signal ENL2R when a low-going transition of L_PORT is detected. When enable signal ENA is active, undershoot sensor 22 is disabled. For the right port, undershoot sensor 22' senses R_PORT and activates signal ENR2L when a low-going transition is detected. Undershoots occur at the end of low-going transitions. Both signals ENL2R and ENR2L are active-low signals that are driven high when bus-switch transistor 20 is enabled by ENA being high.

Switch control 30 contains protection circuitry that connects any undershoot on L_PORT to the gate of bus-switch transistor 20, when signal ENL2R is active (low). This prevents bus-switch transistor 20 from conducting. Likewise, when signal ENR2L is driven low by undershoot sensor 22', R_PORT is connected to the gate of bus-switch transistor 20, so that its gate-to-source voltage remains at zero, even when the source (R_PORT) goes below ground during an undershoot.

Switch control 30 also receives the inverse enable signal ENB from inverter 28. When enable is high, and ENB is low, a high voltage is driven onto the gate of bus-switch transistor 20 to enable conduction, and undershoot protection is disabled.

To prevent the parasitic source-substrate diode from conducting, the substrate under bus-switch transistor 20 is driven below ground by a negative substrate bias. Substrate bias generator 26 applies a negative bias to the p-type substrates n-channel bus-switch transistor 20. A bias of −1.5 to −3.0 volt can be generated using a charge-pump type of bias generator. The same substrate bias can be applied to all n-channel transistors, such as those in switch control 30, undershoot sensors 22, 22', and inverter 28. When a P-well process is used, some of the n-channel transistors can have a different bias, such as ground since the n-channel transistors can be formed in separate wells that are electrically isolated from one another.

Figure 3:
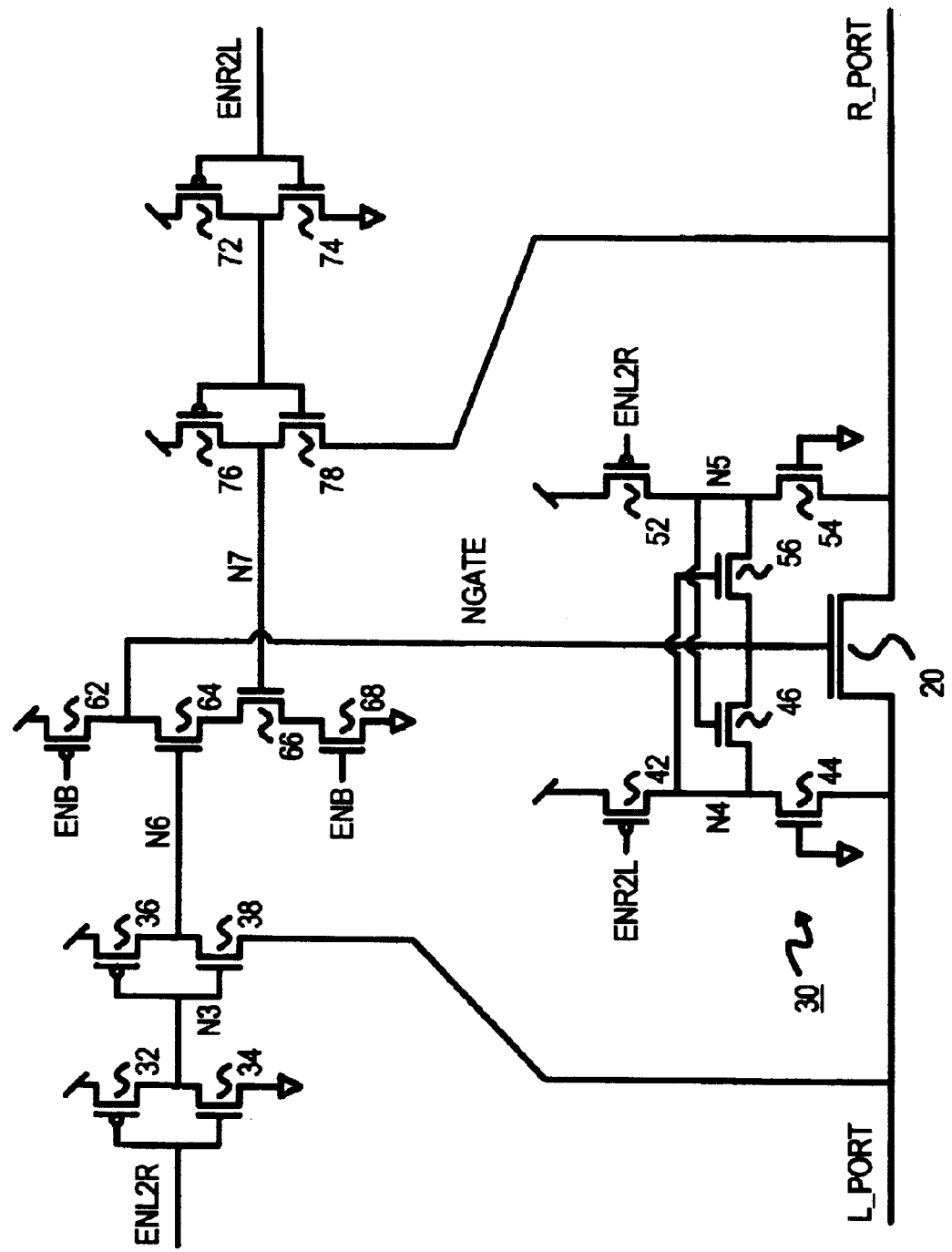
FIG. 3 is a schematic showing the switch control and protection circuit.

FIG. 3 is a schematic showing the switch control and protection circuit. Switch control 30 receives the inverse enable signal ENB and the active-low undershoot sense signals ENL2R and ENR2L. Switch control 30 drives the gate node (NGATE) of bus-switch transistor 20.

When bus-switch transistor 20 is enabled to conduct, ENB is low and ENL2R and ENR2L are both high. Since ENL2R is high, node N6 is also high, enabling n-channel transistor 64. Likewise, since ENR2L is high, node N7 is high, enabling n-channel transistor 66. The low ENB signal is applied to the gate of p-channel transistor 62, which turns on, and to the gate of n-channel transistor 68, which turns off. Gate node NGATE is thus driven high when ENB is low. The high voltage to NGATE turns on bus-switch transistor 20 so that a conducting channel is formed between its source and drain, connecting L_PORT to R_PORT.

P-channel transistors 42, 52 remain off, since ENL2R and ENR2L are high. Grounded-gate n-channel transistors 44, 54 remain off, isolating gate node NGATE from L_PORT and R_PORT.

When bus-switch transistor 20 is to be disabled by ENB going high, and no undershoot is detected, ENL2R and ENR2L remain high, and n-channel transistors 64, 66 remain on. Then the high ENB turns on n-channel transistor 68 but turns off p-channel transistor 62. Gate node NGATE is then discharged to ground, turning off bus-switch transistor 20.

When an undershoot or low-going transition is detected on the left port, ENL2R is driven low. Transistors 32, 34 invert ENL2R to drive node N3, which is applied to the gates of transistors 36, 38. N-channel transistor 38 drives node N6 low by connecting L_PORT to node N6. L_PORT is already low since a low-going transition was detected for ENL2R to be driven low. If L_PORT is below ground (an undershoot), n-channel transistor 38 couples this below-ground voltage to the gate of n-channel transistor 64, ensuring that it remains off even if gate node NGATE goes below ground. If the source of n-channel transistor 38 were merely connected to ground, then when NGATE goes below ground a positive gate-to-source voltage would occur on n-channel transistor 64, causing unwanted conduction.

When ENL2R is driven low by a detected undershoot on L_PORT, p-channel transistor 52 turns on since its gate is ENL2R. Node N5 is driven high, which is also the gate of n-channel connecting transistor 46, which turns on. Thus node N4, the source of n-channel connecting transistor 46, is connected to gate node NGATE. As L_PORT falls below ground during an undershoot, n-channel grounded-gate transistor 44 develops a positive gate-to-source voltage (ground minus L_PORT's voltage) and begins conducting once the under shoot on L_PORT is more than the transistor threshold voltage below ground. Since n-channel transistors 44, 46 are both on, the undershoot on L_PORT is couples to gate node NGATE, which is driven below ground. Furthermore the gate of transistor 56 is connected to N4, preventing undershoots from coupling to R_PORT through connecting transistors 56, 54. Isolation of R_PORT is maintained despite the undershoot on L_PORT since the gates of bus-switch transistor 20 and connecting transistor 56 are also driven by the undershoot, keeping their gate-to-source voltages near zero.

When the undershoot is detected on R_PORT, ENR2L is driven low by the undershoot sensor. Transistors 72, 74 invert ENR2L and drive the gates of transistors 76, 78. N-channel transistor 78 has its source connected to R_PORT rather than ground to couple the below-ground undershoot to the gate of n-channel transistor 66, (node N7) ensuring that it remains off. Since transistor 66 is off, gate node NGATE is disconnected from ground even when transistors 64, 68 remain on.

The low on ENR2L is also applied to the gate of p-channel transistor 42, turning it on. Node N4 is then driven high by p-channel transistor 42. Grounded-gate transistor 44 remains off, since no undershoot is detected on L_PORT.

Node N4 is also the gate of n-channel connecting transistor 56, which turns on and connects gate node NGATE to node N5. Grounded-gate transistor 54 is off until R_PORT falls below ground, then it turns on, conducting the undershoot on R_PORT to node N5, and then through connecting transistor 56 to gate node NGATE. The gate of transistor 46 is also connected to node N5. Since N5 is also driven by the undershoot, it isolates undershoots from R_PORT to L_PORT through connecting transistors 46 and 44. Thus the undershoot on R_PORT is conducted to the gate of bus-switch transistor 20 and the gate of connecting transistor 46, ensuring that it remains off. Isolation is maintained despite undershoots occurring on either port.

Figure 4:
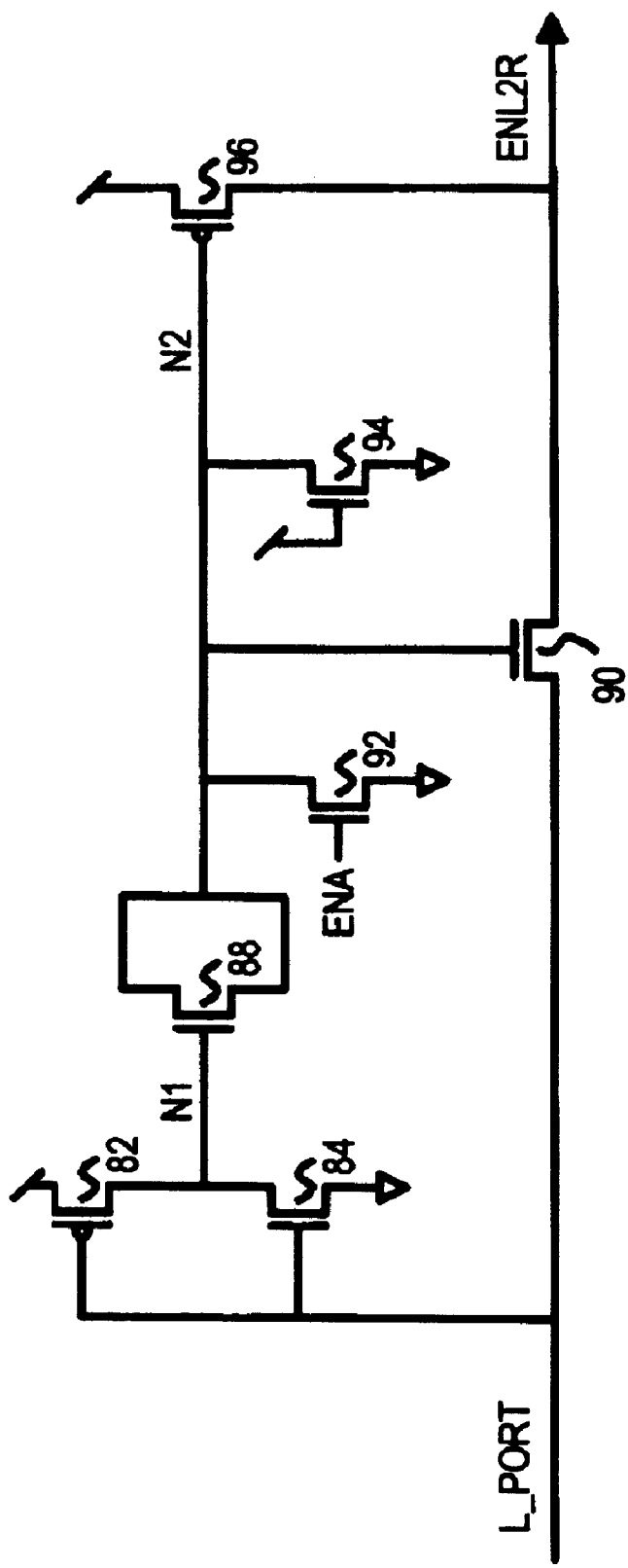
FIG. 4 is a schematic of the undershoot sensor.

FIG. 4 is a schematic of the undershoot sensor. Undershoot sensor 22 receives the L_PORT signal and drives ENL2R low when a high-to-low transition is detected on L_PORT, when an undershoot could occur.

L_PORT is inverted by transistors 82, 84 to drive node N1. A coupling capacitor is formed by transistor 88, which has node N1 applied to its gate and has its source and drain connected together at node N2. Pass gate 90 is an n-channel transistor that connects L_PORT to ENL2R when its gate, node N2, is high, but isolates ENL2R when N2 is low. Node N2 also drives the gate of p-channel pullup transistor 96, which drives ENL2R high when node N2 is low. Thus either pass gate 90 or pullup transistor 96 is on to drive ENL2R.

Signal ENL2R is kept high when the enable signal ENA is high since ENA is applied to the gate of disable n-channel transistor 92, which holds node N2 to ground when the bus-switch transistor is enabled, since no undershoot protection is then needed. Pullup transistor 96 is kept on by node N2, pulling signal ENL2R high.

When L_PORT has a high-to-low transition, node N1 is driven high by p-channel transistor 82. P-channel transistor 82 can be made relatively large so that a fast rise time is obtained for node N1, even when a large coupling capacitor is used as transistor 88. This rapid voltage rise on node N1 is capacitively coupled through coupling capacitor transistor 88, causing a rise in the voltage of node N2. The size of the voltage rise on node N2 is somewhat smaller than the voltage rise on node N1 in proportion to the coupling ratio, which is the capacitance of transistor 88 divided by the total capacitances on node N2.

The rise in voltage coupled to node N2 turns on pass gate 90, causing the low on L_PORT to drive ENL2R low. The undershoot may be partially dissipated or absorbed by the input capacitances of signal ENL2R, helping to minimize the undershoot. Node N2 is then gradually pulled back to ground by n-channel keeper transistor 94. Once node N2 falls near ground, p-channel pullup transistor 96 turns on and pass gate 90 turns off, and ENL2R is driven high again.

FIGS. 5A–C are waveforms showing operation of the bi-directional undershoot-isolating bus switch in isolation mode. In FIG. 5A, enable ENA is low, putting the bus-switch transistor is in isolation mode in which it's source and drain are disconnected from each other. The right port R_PORT remains high and must be isolated from the undershoot that occurs on the left port L_PORT. The left port transitions from high to low and back high in the simulated waveform. An undershoot is simulated since L_PORT falls below ground to −2 volts. In an actual undershoot, L_PORT would not remain below ground for such a long time period, but ringing or other oscillation could occur.

FIG. 5B shows operation of the undershoot detector. When L_PORT switches from high to low, node N1 is rapidly driven high. This voltage change is capacitively coupled to node N2, which also goes high, but to a reduced high voltage of about 2–3 volts. Once the low-going transition ends, the keeper transistor gradually pulls node N2 back toward ground. Signal ENL2R is driven low once node N2 rises above the n-channel transistor threshold. Signal ENL2R stays low as long as L_PORT remains below ground, thus isolation is effective throughout the entire duration of the undershoot and it is independent of the width of the undershoot pulse.

Once L_PORT transitions high again, node N1 is driven low, and the voltage drop is capacitively coupled into node N2, which can be driven below ground for a short time. Signal ENL2R is driven back high as node N2 goes low.

FIG. 5C shows the operation of the switch control logic. The low-going ENL2R drives node N3 high and node N6 low. Node N7 remains high since ENR2L does not change. Node N5 is driven high by ENL2R. The high voltage on N5 turns on the connecting transistor, which connect gate node NGATE with node N4. The grounded-gate transistor turns on as its source, L_PORT, falls below ground, coupling the undershoot on L_PORT to its drain, node N4. Node N4 and gate node NGATE then fall with L_PORT below ground.

Gate node NGATE, node N4 and node N6 all fall below ground during the undershoot on L_PORT. When L_PORT is −2 volts, typical node voltages are N1=5v, N2=2.5v, N3=5v, N4=−2v, N5=5v, and N6=−2v

ALTERNATE EMBODIMENTS

Several other embodiments are contemplated by the inventor. The undershoot-protection circuit can also used in more complex switch networks.

The invention can be reversed for use with p-channel bus-switch transistors. Overshoot as well as undershoot protection could be provided. The invention can be applied to non-standard processes such as silicon-on-insulator (SOI). A p-channel transistor can be added in parallel to the n-channel bus-switch transistor to create a full-CMOS bus switch. The protection circuit for the n-channel bus-switch transistor is still effective. Other transistors, resistors, or capacitors may be added in parallel or in series in several locations the circuits.

A pullup p-channel transistor can be added to either bus, as can a pullup resistor. A pullup resistor can also be added in series with a p-channel pullup transistor. The terms source and drain can be considered interchangeable, depending on the current voltages applied. Likewise, the input and output of the bus switch can be reversed or interchanged for Li-directional bus switches.

A single integrated circuit chip can contain several bus-switch transistors in parallel, each with an undershoot-protection circuit. Enable signals may drive all bus-switch transistors.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word "means" is recited in a claim element, Applicant intends for the claim element to fall under 35 USC §112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A bus switch with undershoot protection on both ports comprising:
   a bus-switch transistor controlled by a gate node that controls current conduction between a first port and a second port;
   a first detector, coupled to the first port, for activating a first signal in response to a low-going transition detected on the first port;

a first fixed-gate transistor coupled to conduct an undershoot on the first port to a first node;

a first connecting transistor coupled to conduct the undershoot from the first node to the gate node when the first signal is activated;

an enable gate, receiving an enable signal, for driving an enabling voltage onto the gate node to enable conducting by the bus-switch transistor, and for driving a disabling voltage onto the gate node to isolate the first port from the second port;

a second detector, coupled to the second port, for activating a second signal in response to a low-going transition detected on the second port;

a second fixed-gate transistor coupled to conduct an undershoot on the second port to a second node; and a second connecting transistor coupled to conduct the undershoot from the second node to the gate node when the second signal is activated, whereby undershoots are conducted through fixed-gate and connecting transistors to the gate node to prevent channel conduction by the bus-switch transistor.

2. The bus switch of claim 1 wherein the first node is applied to a gate of the second conducting transistor;

wherein the second node is applied to a gate of the first conducting transistor;

further comprising:

a first signaling transistor, responsive to the second signal and coupled to drive the first node when the second signal is activated;

a second signaling transistor, responsive to the first signal and coupled to drive the second node when the first signal is activated.

3. The bus switch of claim 2 wherein the first and second signaling transistors are p-channel transistors with sources coupled to a power supply.

4. The bus switch of claim 1 wherein the first and second fixed-gate transistors are n-channel transistors with gates connected to a ground.

5. The bus switch of claim 4 wherein the bus-switch transistor is an n-channel transistor.

6. The bus switch of claim 5 further comprising:

a back-bias generator for generating a bias applied to substrate terminals of n-channel transistors including the bus-switch transistors.

7. The bus switch of claim 1 wherein the enable gate further comprises:

a first blocking transistor for blocking the enable gate from driving the disabling voltage onto the gate node when the first signal is activated; and a second blocking transistor for blocking the enable gate from driving the disabling voltage onto the gate node when the second signal is activated, whereby the enable gate is isolated when the first or second signal is activated.

8. The bus switch of claim 7 further comprising:

a first inverter, receiving the first signal, for generating a first inverted signal;

a first port-sourced inverter, having an n-channel transistor with a source coupled to the first port and a gate connected to the first inverted signal, for driving a gate of the first blocking transistor;

a second inverter, receiving the second signal, for generating a second inverted signal; and a second port-sourced inverter, having an n-channel transistor with a source coupled to the second port and a gate connected to the second inverted signal, for driving a gate of the second blocking transistor, whereby undershoots on the first or second ports are coupled to gates of the first and second blocking transistors through port-sourced inverters.

9. The bus switch of claim 1 wherein the first detector comprises:

a first coupling capacitor having a first terminal and a second terminal;

a first detector inverter, receiving the first port, for driving the first terminal of the first coupling capacitor when the low-going transition is detected on the first port;

a first pass transistor, controlled by the second terminal of the first coupling capacitor, for connecting the first port to the first signal when the low-going transition is detected;

a first disable transistor, controlled by the second terminal of the first coupling capacitor, for deactivating the first signal.

10. The bus switch of claim 9 wherein the second detector comprises:

a second coupling capacitor having a first terminal and a second terminal;

a second detector inverter, receiving the second port, for driving the first terminal of the second coupling capacitor when the low-going transition is detected on the second port;

a second pass transistor, controlled by the second terminal of the second coupling capacitor, for connecting the second port to the second signal when the low-going transition is detected;

a second disable transistor, controlled by the second terminal of the second coupling capacitor, for deactivating the second signal.

11. The bus switch of claim 10 wherein the first detector further comprises:

a first keeper transistor for discharging the second terminal of the first coupling capacitor;

and wherein the second detector further comprises:

a second keeper transistor for discharging the second terminal of the second coupling capacitor.

12. The bus switch of claim 11 wherein the first and second pass transistors are n-channel transistors.

13. A bus switch comprising:

an n-channel bus-switch transistor, having a source connected to a first bus, a drain connected to a second bus, and a gate connected to a gate node;

a first fixed-gate transistor, having a source connected to a first node, a drain connected to the first bus, and a gate connected to a fixed voltage;

a second fixed-gate transistor, having a source connected to a second node, a drain connected to the second bus, and a gate connected to the fixed voltage;

a first connecting transistor, having a source connected to the gate node, a drain connected to the first node, and a gate connected to the second node;

a first signaling transistor, having a drain connected to the first node, a source connected to a high voltage, and a gate connected to a second signal;

a second connecting transistor, having a source connected to the gate node, a drain connected to the second node, and a gate connected to the first node;

a second signaling transistor, having a drain connected to the second node, a source connected to the high voltage, and a gate connected to a first signal;

a first detector, connected to the first bus, for activating the first signal when a transition is detected on the first bus;

a second detector, connected to the second bus, for activating the second signal when a transition is detected on the second bus.

14. The bus switch of claim 13 wherein the first and second signaling transistors are p-channel transistors, and wherein the high voltage is a power-supply voltage.

15. The bus switch of claim 14 wherein the first and second fixed-gate transistors and the first and second connecting transistors are n-channel transistors and wherein the fixed voltage is ground.

16. The bus switch of claim 15 wherein the first and second signals are activated by driving to a lower voltage.

17. The bus switch of claim 16 further comprising:

an enable gate having:

a p-channel transistor with a gate connected to a disable signal and a drain connected to the gate node and a source connected to the power-supply voltage;

a series of transistors connecting between the gate node and ground, the series of transistors comprising a first and a second n-channel blocking transistor and an n-channel disable transistor, the n-channel disable transistor having a gate connected to the disable signal, the first n-channel blocking transistor having a gate that disables conduction when the first signal is activated, the second n-channel blocking transistor having a gate that disables conduction when the second signal is activated.

18. The bus switch of claim 17 further comprising:

a first inverter, receiving the first signal, for generating a first inverted signal;

a first bus-source inverter, having a p-channel and an n-channel transistor with gates connected to the first inverted signal, and drains driving the gate of the first n-channel blocking transistor, wherein a source of the n-channel transistor is coupled to the first bus while a source of the p-channel transistor is coupled to the power-supply voltage;

a second inverter, receiving the second signal, for generating a second inverted signal;

a second bus-source inverter, having a p-channel and an n-channel transistor with gates connected to the second inverted signal, and drains driving the gate of the second n-channel blocking transistor, wherein a source of the n-channel transistor is coupled to the second bus while a source of the p-channel transistor is coupled to the power-supply voltage.

19. An undershoot-protecting bus switch comprising:

bus switch means for selectively connecting and isolating a first bus from a second bus in response to a control gate;

first fixed-gate transistor means, coupled between the first bus and a first node, for conducting an undershoot on the first bus to the first node;

first connecting transistor means, coupled between the first node and the control gate, for coupling the undershoot from the first node to the control gate, the first connecting transistor means responsive to a first gate;

second fixed-gate transistor means, coupled between the second bus and a second node, for conducting an undershoot on the second bus to the second node;

second connecting transistor means, coupled between the second node and the control gate, for coupling the undershoot from the second node to the control gate, the second connecting transistor means responsive to a second gate;

first signaling transistor means for activating the second gate of the second connecting transistor means when the undershoot is detected on the second bus;

second signaling transistor means for activating the first gate of the first connecting transistor means when the undershoot is detected on the first bus;

enable gate means for driving the control gate with an enabling signal when the bus switch means is to connect the first bus to the second bus, and for driving a disabling signal onto the control gate when the first bus is to be isolated from the second bus;

first isolating transistor means, in the enable gate means, for isolating the disabling signal from the control gate when the undershoot is detected on the first bus;

second isolating transistor means, in the enable gate means, for isolating the disabling signal from the control gate when the undershoot is detected on the second bus.

20. The undershoot-protecting bus switch of claim 19 further comprising:

first detector means, coupled to the first bus, for detecting a transition on the first bus and signaling the second signaling transistor means and the first isolating transistor means when the undershoot can occur on the first bus;

second detector means, coupled to the second bus, for detecting a transition on the second bus and signaling the first signaling transistor means and the second isolating transistor means when the undershoot can occur on the second bus.

* * * * *